(12) United States Patent
Kawabe et al.

(10) Patent No.: US 6,608,524 B2
(45) Date of Patent: Aug. 19, 2003

(54) AUTOMATIC GAIN CONTROL CIRCUIT

(75) Inventors: Akira Kawabe, Osaka (JP); Kouji Okamoto, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/163,456

(22) Filed: Jun. 7, 2002

(65) Prior Publication Data

US 2002/0186081 A1 Dec. 12, 2002

(30) Foreign Application Priority Data

Jun. 8, 2001 (JP) .......................... 2001-174590

(51) Int. Cl.[7] .............. H03G 3/20; H03G 3/10; H03F 3/04; H01J 40/14
(52) U.S. Cl. ............. 330/137; 330/129; 330/279; 330/304; 250/214 AG
(58) Field of Search ............... 330/129, 137, 330/279, 304; 250/214 AG

(56) References Cited

U.S. PATENT DOCUMENTS

| 4,665,402 | A | * | 5/1987 | Young .................. 342/91 |
| 4,673,970 | A | * | 6/1987 | Matsumoto et al. ....... 348/646 |
| 5,422,601 | A | | 6/1995 | Kovacs et al. |
| 5,796,535 | A | * | 8/1998 | Tuttle et al. .................. 360/51 |
| 5,901,347 | A | * | 5/1999 | Chambers et al. ....... 455/234.1 |

* cited by examiner

*Primary Examiner*—Patricia Nguyen
(74) *Attorney, Agent, or Firm*—McDermott, Will & Emery

(57) ABSTRACT

In a state where a PLL circuit is not locked, a gain control signal according to the difference between a peak value of a reproduced signal and the upper or lower limit value of the dynamic range of an A/D converter is given to a variable gain amplifier. In a state where the PLL circuit is locked, a gain control signal according to the difference between the reproduced signal and a reference value that corresponds to a level to which the reproduced signal belongs is given to the variable gain amplifier for each sampling point of the A/D converter. The variable gain amplifier amplifies the reproduced signal with a gain according to the gain control signal.

10 Claims, 13 Drawing Sheets

FIG. 6

| Level of DS | MSB1 | MBS2 | MBS3 | MBS4 | SEL1 |
|---|---|---|---|---|---|
| LV5 | + | + | + | + | d5 |
| LV4 | + | + | + | − | d4 |
| LV3 | + | + | − | − | d3 |
| LV2 | + | − | − | − | d2 |
| LV1 | − | − | − | − | d1 |

<Not locked>

Ideal sampling points
(— ··· AS4, ○ ··· DS)

<Locked>

Sampling points
(— ··· AS4, ○ ··· DS)

AUTOMATIC GAIN CONTROL CIRCUIT

BACKGROUND OF THE INVENTION

1. Field of the Invention

The present invention relates to an automatic gain control circuit. More particularly, the present invention relates to an automatic gain control circuit for controlling an amplitude level of a reproduced signal obtained from a recording medium such as an optical disk or a magnetic disk to be at a constant level.

2. Description of the Background Art

In a reproduced signal processing circuit of an optical disk apparatus, laser light is illuminated onto pits on a disk, and the reflected light is picked up by an optical pickup and is converted into an electric signal, thereby obtaining a reproduced signal. The reproduced signal thus obtained is amplified by a preamplifier, and then the amplitude level thereof is adjusted by a variable gain amplifier. In the variable gain amplifier, the amplitude level of the reproduced signal is adjusted so as to be matched with the dynamic range of an A/D converter in a subsequent stage. The reproduced signal, whose amplitude level has been adjusted by the variable gain amplifier, is subjected to a waveform equalization process, and then quantized by the A/D converter. The reproduced signal, which has been quantized, is decoded by a digital processing section into binary reproduced data.

In the reproduced signal processing circuit, the gain of the variable gain amplifier is controlled as follows in order to match the amplitude level of the reproduced signal with the dynamic range (input voltage range) of the A/D converter. First, the reproduced signal, which has been subjected to a waveform equalization process, is subjected to a full wave rectification process, and then passed through a low-pass filter so as to smooth the waveform peaks. Thus, the amplitude level of the reproduced signal is derived. Then, the derived amplitude level is compared with a reference level that corresponds to the dynamic range of the A/D converter so as to calculate the error therebetween. Then, a gain control signal having a voltage level according to the calculated error is generated. The variable gain amplifier amplifies the reproduced signal with a gain according to the voltage level of the gain control signal. Thus, the gain of the variable gain amplifier is controlled according to the error between the amplitude level of the reproduced signal and the reference level, whereby the reproduced signal, which has been amplified by the variable gain amplifier, has an amplitude level that is matched with the dynamic range of the A/D converter in a subsequent state.

In the automatic gain control circuit, it is required to adjust the amplitude level of the reproduced signal so that the quantization process can be performed efficiently in the A/D converter in a subsequent stage, and to adjust, in real time, the amplitude level of the input reproduced signal. However, it is expected that the disk read speed will be increased and the wavelength of the light source will be shortened in the future, whereby the SN ratio of the reproduced signal may deteriorate and the high frequency component thereof may be weakened. The deterioration in the SN ratio of the reproduced signal and the weakening of the high frequency component thereof will make the output of the variable gain amplifier unstable.

SUMMARY OF THE INVENTION

An object of the present invention is to provide an automatic gain control circuit in which a stable output can be obtained from a variable gain amplifier.

According to the present invention, an automatic gain control circuit includes a variable gain amplifier, an A/D converter, a clock generation circuit, an error calculation section and a control signal generation circuit. The variable gain amplifier amplifies a reproduced signal from a recording medium. The A/D converter quantizes the reproduced signal, which has been amplified by the variable gain amplifier. The clock generation circuit generates a clock that is synchronized with the reproduced signal, which has been quantized by the A/D converter. The error calculation section generates an error signal according to a difference between the reproduced signal, which has been quantized by the A/D converter, and one of n values (n is a positive integer) that corresponds to the reproduced signal, which has been quantized by the A/D converter, the n values being determined by a recording constraint and a recording format for the recording medium and a method for weighting the reproduced signal from the recording medium. The control signal generation circuit generates a gain control signal based on the error signal generated by the error calculation section. The A/D converter quantizes the reproduced signal, which has been amplified by the variable gain amplifier, in synchronism with the clock from the clock generation circuit. The variable gain amplifier amplifies the reproduced signal from the recording medium with a gain according to a level of the gain control signal from the control signal generation circuit.

In the automatic gain control circuit described above, not only the peak values of the reproduced signal, which has been quantized by the A/D converter, but also the intermediate values thereof, are used in the generation of the error signal. Therefore, as compared to a case where only the peak values are used, the output of the variable gain amplifier is more stable.

It is preferred that the error calculation section generates the error signal when one of the n values that corresponds to the reproduced signal, which has been quantized by the A/D converter, is a desired value.

With the automatic gain control circuit described above, the error signal can be generated while selectively using only one or more of the n values whose difference from the reproduced signal has a small variation.

It is preferred that when the clock from the clock generation circuit is not synchronized with the reproduced signal, which has been quantized by the A/D converter, the error calculation section generates the error signal according to a difference between a peak of the reproduced signal, which has been quantized by the A/D converter, and a predetermined reference value, whereas when the clock from the clock generation circuit is synchronized with the reproduced signal, which has been quantized by the A/D converter, the error calculation section generates the error signal according to a difference between the reproduced signal, which has been quantized by the A/D converter, and one of n values (n is a positive integer) that corresponds to the reproduced signal, which has been quantized by the A/D converter, the n values being determined by a recording constraint and a recording format for the recording medium and a method for weighting the reproduced signal from the recording medium.

It is preferred that the predetermined reference value is an upper or lower limit value of a dynamic range of the A/D converter.

In the automatic gain control circuit described above, when the clock from the clock generation circuit is not synchronized with the reproduced signal, which has been quantized by the A/D converter, the level of the reproduced signal, which has been quantized by the A/D converter, changes irregularly. Nevertheless, the peak of the reproduced signal can be detected. Therefore, the error calculation section generates the error signal according to the difference between a peak value of the reproduced signal, which has been quantized by the A/D converter, and the upper or lower limit value of the dynamic range of the A/D converter. Then, the control signal generation circuit generates the gain control signal based on the error signal. The variable gain amplifier amplifies the reproduced signal from the recording medium with a gain according to the gain control signal. In this way, the difference between the peak value of the reproduced signal, which has been quantized by the A/D converter, and the upper or lower limit value of the dynamic range of the A/D converter is reduced. Thus, the amplitude level of the reproduced signal amplified by the variable gain amplifier is brought closer to the dynamic range of the A/D converter.

When the clock from the clock generation circuit is synchronized with the reproduced signal, which has been quantized by the A/D converter, the reproduced signal, which has been quantized by the A/D converter, takes a level that is substantially equal to one of n values. The error calculation section generates the error signal according to the difference between the reproduced signal, which has been quantized by the A/D converter, and one of the n values that corresponds to the reproduced signal. Then, the control signal generation circuit generates the gain control signal based on the error signal. The variable gain amplifier amplifies the reproduced signal from the recording medium with a gain according to the gain control signal. In this way, the amplitude level of the reproduced signal, which has been quantized by the A/D converter, is adjusted to a level that is matched with the dynamic range of the A/D converter. Thus, not only the peak values of the reproduced signal, which has been quantized by the A/D converter, but also the intermediate values thereof, are used in the generation of the error signal. Therefore, as compared to a case where only the peak values are used, the output of the variable gain amplifier is better matched with the dynamic range of the A/D converter and is more stable.

As described above, in the automatic gain control circuit, when the clock from the clock generation circuit is not synchronized with the reproduced signal, which has been quantized by the A/D converter, an error signal according to the difference between the peak value of the reproduced signal, which has been quantized by the A/D converter, and the upper or lower limit value of the dynamic range of the A/D converter is generated. In this way, until the clock from the clock generation circuit is synchronized with the reproduced signal, which has been quantized by the A/D converter, the amplitude level of the output of the variable gain amplifier can be brought somewhat closer to the level that is matched with the dynamic range of the A/D converter. As a result, it is possible to reduce the amount of time required for bringing the amplitude level of the output of the variable gain amplifier to a level that is matched with the dynamic range of the A/D converter and is stable.

It is preferred that the predetermined reference value is a value that is smaller than an upper limit value of a dynamic range of the A/D converter and greater than a median value thereof, or a value that is greater than a lower limit value of the dynamic range of the A/D converter and smaller than the median value thereof.

With the automatic gain control circuit described above, it is possible to prevent the amplitude level of the output of the variable gain amplifier from exceeding the dynamic range of the A/D converter.

It is preferred that when the clock from the clock generation circuit is not synchronized with the reproduced signal, which has been quantized by the A/D converter, the error calculation section generates the error signal according to a difference between a peak of the reproduced signal from the variable gain amplifier and a predetermined reference value, whereas when the clock from the clock generation circuit is synchronized with the reproduced signal, which has been quantized by the A/D converter, the error calculation section generates the error signal according to a difference between the reproduced signal, which has been quantized by the A/D converter, and one of n values (n is a positive integer) that corresponds to the reproduced signal, which has been quantized by the A/D converter, the n values being determined by a recording constraint and a recording format for the recording medium and a method for weighting the reproduced signal from the recording medium.

With the automatic gain control circuit described above, until the clock from the clock generation circuit is synchronized with the reproduced signal, which has been quantized by the A/D converter, the amplitude level of the output of the variable gain amplifier can be brought somewhat closer to the level that is matched with the dynamic range of the A/D converter. As a result, it is possible to reduce the amount of time required for bringing the amplitude level of the output of the variable gain amplifier to a level that is matched with the dynamic range of the A/D converter and is stable.

It is preferred that when the clock from the clock generation circuit is not synchronized with the reproduced signal, which has been quantized by the A/D converter, the control signal generation circuit generates the gain control signal based on a product between the error signal generated by the error calculation section and a first multiplier, whereas when the clock from the clock generation circuit is synchronized with the reproduced signal, which has been quantized by the A/D converter, the control signal generation circuit generates the gain control signal based on a product between the error signal generated by the error calculation section and a second multiplier that is smaller than the first multiplier.

With the automatic gain control circuit described above, when the clock from the clock generation circuit is not synchronized with the reproduced signal, which has been quantized by the A/D converter, the gain control signal is generated based on the product between the first, greater, multiplier and the error signal. Therefore, the variable gain amplifier amplifies the reproduced signal from the recording medium with a gain that is greater than that when the gain control signal is generated based on the second multiplier. In this way, the amplitude level of the output of the variable gain amplifier can be brought roughly to the dynamic range of the A/D converter. On the other hand, when the clock from the clock generation circuit is synchronized with the reproduced signal, which has been quantized by the A/D converter, the gain control signal is generated based on the product between the second, smaller, multiplier and the error signal. Therefore, the variable gain amplifier amplifies the reproduced signal from the recording medium with a gain that is smaller than when the gain control signal is generated based on the first multiplier. In this way, the amplitude level of the output of the variable gain amplifier is finely adjusted to a level that is matched with the dynamic range of the A/D converter and is stable.

As described above, in the automatic gain control circuit, when the clock from the clock generation circuit is not synchronized with the reproduced signal, which has been quantized by the A/D converter, the gain control signal is generated based on the product between the first multiplier and the error signal, whereas when the clock from the clock generation circuit is synchronized with the reproduced signal, which has been quantized by the A/D converter, the gain control signal is generated based on the product between the second multiplier and the error signal. Thus, the amplitude level of the output of the variable gain amplifier can be adjusted effectively.

It is preferred that the control signal generation circuit changes the second multiplier depending on a format of data recorded on the recording medium.

With the automatic gain control circuit described above, the amplitude level of the output of the variable gain amplifier can be adjusted effectively according to the format of the data recorded on the recording medium.

BRIEF DESCRIPTION OF THE DRAWINGS

FIG. 6 illustrates the relationship between the input and the output of a decoder illustrated in FIG. 4.

DESCRIPTION OF THE PREFERRED EMBODIMENTS

Figure 1:
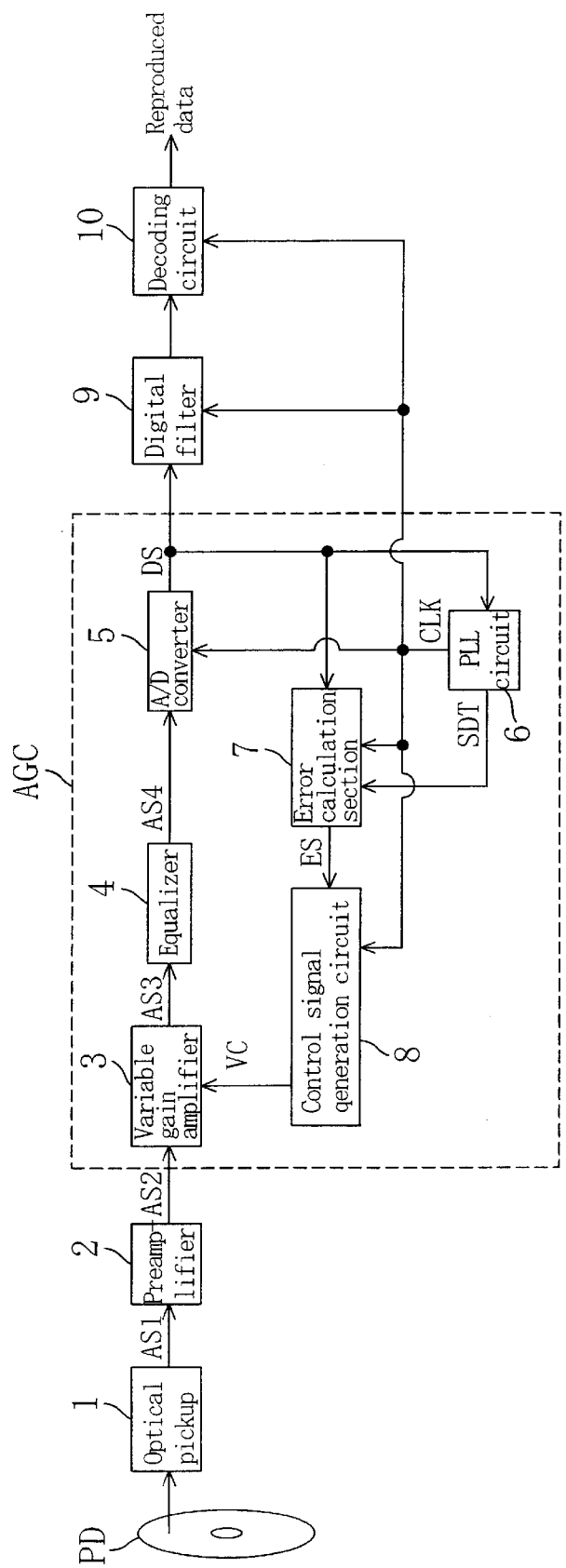
FIG. 1 is a block diagram illustrating a general configuration of a reproduced signal processing circuit according to the first embodiment of the present invention.

Embodiments of the present invention will now be described in detail with reference to the drawings. Note that like elements will be denoted by like reference numerals throughout the drawings, and will not be described repeatedly.

FIRST EMBODIMENT

GENERAL CONFIGURATION OF REPRODUCED SIGNAL PROCESSING CIRCUIT

FIG. 1 is a block diagram illustrating a general configuration of a reproduced signal processing circuit according to the first embodiment of the present invention. The reproduced signal processing circuit illustrated in FIG. 1 is a reproduced signal processing circuit used in an optical disk apparatus. An optical disk PD, which is a recording medium, has RLL (Run Length Limited)-encoded data recorded thereon in an NRZI (Non Return to Zero Inverse) format. The reproduced signal processing circuit illustrated in FIG. 1 uses a PRML (Partial Response Maximum Likelihood) signal processing technique. The reproduced signal processing circuit illustrated in FIG. 1 includes an optical pickup 1, a preamplifier 2, a variable gain amplifier 3, an equalizer 4, an A/D converter 5, a PLL circuit 6, an error calculation section 7, a control signal generation circuit 8, a digital filter 9 and a decoding circuit 10.

Typically, information such as a video image or music is first encoded, after which it is modulated and written to the optical disk PD as pits. The optical pickup 1 converts reflected light, which is obtained by illuminating laser light onto the pits on the optical disk PD, into an electric signal, and outputs the electric signal as a reproduced signal AS1. The preamplifier 2 amplifies the reproduced signal AS1 from the optical pickup 1, and outputs the amplified signal as a reproduced signal AS2.

The variable gain amplifier 3 amplifies the reproduced signal AS2 from the preamplifier 2 with a gain according to a gain control signal VC from the control signal generation circuit 8, and outputs the amplified signal as a reproduced signal AS3. The equalizer 4 boosts a high frequency component of the reproduced signal AS3 from the variable gain amplifier 3 to perform a waveform equalization process, and outputs the resultant signal as a reproduced signal AS4. The A/D converter 5 quantizes the reproduced signal AS4 from the equalizer 4 in synchronism with a clock CLK from the PLL circuit 6, and outputs the quantized signal as a reproduced signal DS. The PLL circuit 6 generates the clock CLK, which synchronized with the reproduced signal DS from the A/D converter 5. Moreover, the PLL circuit 6 outputs a sync detection signal SDT at H level (logical high level) when the clock CLK is synchronized with the reproduced signal DS from the A/D converter 5, i.e., when the PLL circuit 6 is locked, and outputs the sync detection signal SDT at L level (logical low level) when the clock CLK is not synchronized with the reproduced signal DS from the A/D converter 5, i.e., when the PLL circuit 6 is not locked. The error calculation section 7 receives the reproduced signal DS from the A/D converter 5, and the clock CLK and the sync detection signal SDT from the PLL circuit 6, and outputs an error signal ES according to the difference between the reproduced signal DS from the A/D converter 5 and a predetermined reference value. The control signal generation circuit 8 operates in synchronism with the clock CLK from the PLL circuit 6, and generates the analog gain control signal VC based on the error signal ES so as to output the generated signal to the variable gain amplifier 3. The variable gain amplifier 3, the equalizer 4, the A/D converter 5, the PLL circuit 6, the error calculation section 7 and the control signal generation circuit 8 as described above together form an automatic gain control circuit AGC.

The digital filter 9 operates in synchronism with the clock CLK from the PLL circuit 6, and performs a correction operation (PR equalization) on the reproduced signal DS from the A/D converter 5 for the decoding operation by the decoding circuit 10. The decoding circuit 10 decodes (by Viterbi decoding) the reproduced signal, which has been corrected by the digital filter 9, into binary reproduced data.

INTERNAL CONFIGURATION OF ERROR CALCULATION SECTION 7

Figure 2:
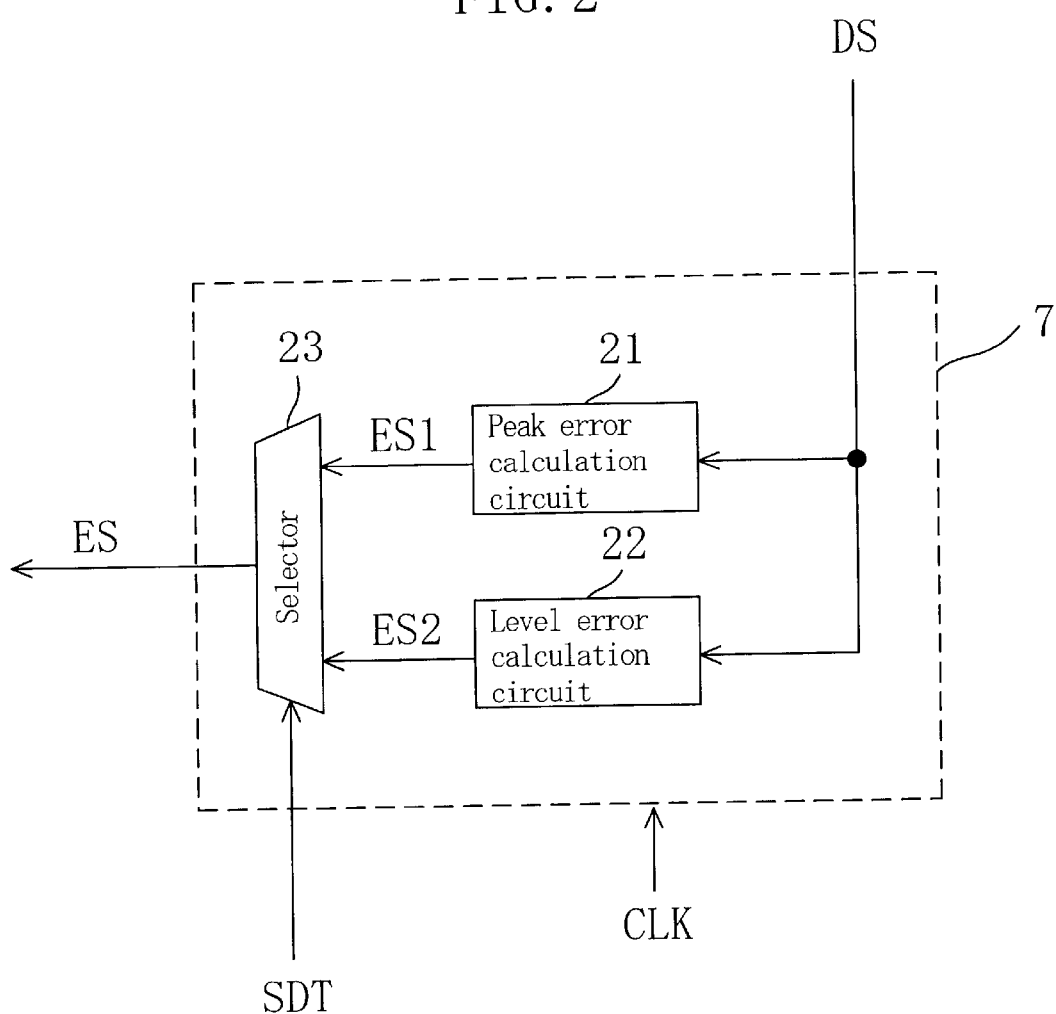
FIG. 2 is a block diagram illustrating an internal configuration of an error calculation section illustrated in FIG. 1.

FIG. 2 is a block diagram illustrating an internal configuration of the error calculation section 7 illustrated in FIG. 1. Referring to FIG. 2, the error calculation section 7 includes a peak error calculation circuit 21, a level error calculation circuit 22 and a selector 23. The peak error calculation circuit 21 detects the peak value of the reproduced signal DS from the A/D converter 5, and generates an error signal ES1 according to the difference between the detected peak value and the upper or lower limit value of the dynamic range of the A/D converter 5. The level error calculation circuit 22 compares the reproduced signal DS from the A/D converter 5 with four threshold values TH1 to TH4 (to be described later), and determines the level to which the reproduced signal DS belongs, among five levels LV1 to LV5 (to be described later) that are determined by the threshold values TH1 to TH4. Then, the level error calculation circuit 22 generates an error signal ES2 according to the difference between one of reference values d1 to d5 (to be described later) that corresponds to the determined one of the levels LV1 to LV5 and the reproduced signal DS. The selector 23 outputs the error signal ES1 from the peak error calculation circuit 21 as the error signal ES when the sync detection signal SDT from the PLL circuit 6 is at L level, and outputs the error signal ES2 from the level error calculation circuit 22 as the error signal ES when the sync detection signal SDT is at H level.

INTERNAL CONFIGURATION OF PEAK ERROR CALCULATION CIRCUIT 21

Figure 3:
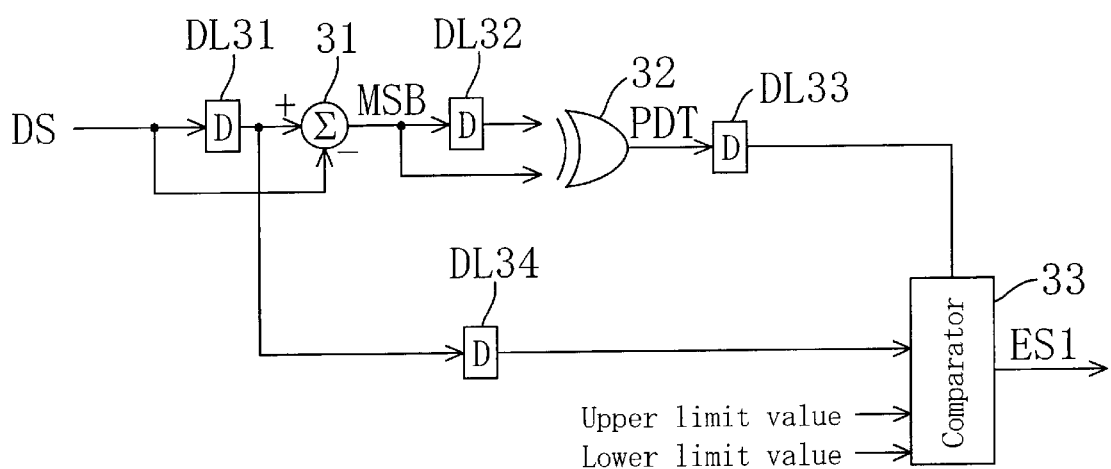
FIG. 3 is a block diagram illustrating an internal configuration of a peak error calculation circuit illustrated in FIG. 2.

FIG. 3 is a block diagram illustrating an internal configuration of the peak error calculation circuit 21 illustrated in FIG. 2. Referring to FIG. 3, the peak error calculation circuit 21 includes delay elements DL31 to DL34, an adder 31, an EX-OR circuit 32 and a comparator 33.

The delay element DL31 delays the reproduced signal DS from the A/D converter 5 by one cycle of the clock CLK from the PLL circuit 6. The adder 31 obtains the difference between the reproduced signal DS delayed by the delay element DL31 and the reproduced signal DS from the A/D converter 5, and outputs the sign MSB of the difference. Thus, the adder 31 obtains the difference between two data points of the reproduced signal DS that are adjacent to each other in time, and outputs the sign MSB of the difference. The delay element DL32 delays the sign MSB obtained by the adder 31 by one cycle of the clock CLK from the PLL circuit 6. The EX-OR circuit 32 outputs, as a detection signal PDT, the exclusive-OR between the sign MSB delayed by the delay element DL32 and the sign MSB obtained by the adder 31. Thus, the EX-OR circuit 32 detects a change over time of the sign MSB [(+)→(−), (−)→(+)]. The detection signal PDT is at H level when the sign MSB changes, and at L level when the sign MSB does not change. The delay element DL33 delays the detection signal PDT from the EX-OR circuit 32 by a predetermined amount of time. The delay element DL34 delays the reproduced signal DS from the delay element DL31 by a predetermined amount of time. The comparator 33 outputs the error signal ES1 according to the difference between the reproduced signal DS from the delay element DL34 and the upper or lower limit value of the dynamic range of the A/D converter 5, when the detection signal PDT from the delay element DL33 is at H level. Specifically, the comparator 33 outputs the error signal ES1 according to the difference between the reproduced signal DS and the upper limit value of the dynamic range of the A/D converter 5 when the change over time of the sign MSB is [(+)→(−)], and outputs the error signal ES1 according to the difference between the reproduced signal DS and the lower limit value of the dynamic range of the A/D converter 5 when the change over time of the sign MSB is [(−)→(+)]. On the other hand, when the detection signal PDT from the delay element DL33 is at L level, the comparator 33 keeps the previous value of the error signal ES1.

As described above, the peak error calculation circuit 21 outputs the error signal ES1 according to the difference between the peak value of the reproduced signal DS and the upper or lower limit value of the dynamic range of the A/D converter 5, wherein the value of the reproduced signal DS when the sign MSB changes is used as the peak value.

INTERNAL CONFIGURATION OF LEVEL ERROR CALCULATION CIRCUIT 22

Figure 4:
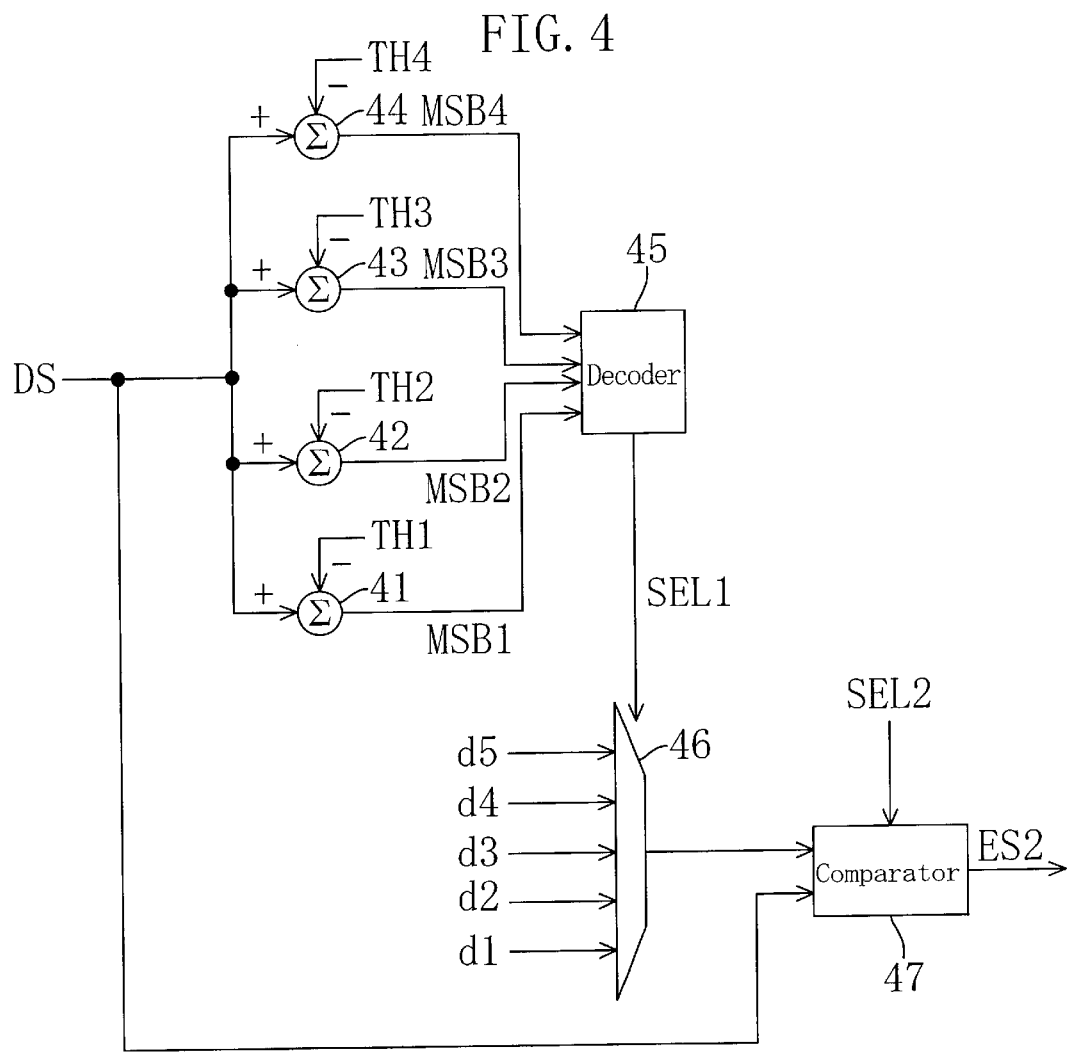
FIG. 4 is a block diagram illustrating an internal configuration of a level error calculation section illustrated in FIG. 2.

FIG. 4 is a block diagram illustrating an internal configuration of the level error calculation circuit 22 illustrated in FIG. 2. Referring to FIG. 4, the level error calculation circuit 22 includes adders 41 to 44, a decoder 45, a selector 46 and a comparator 47.

Figure 5:
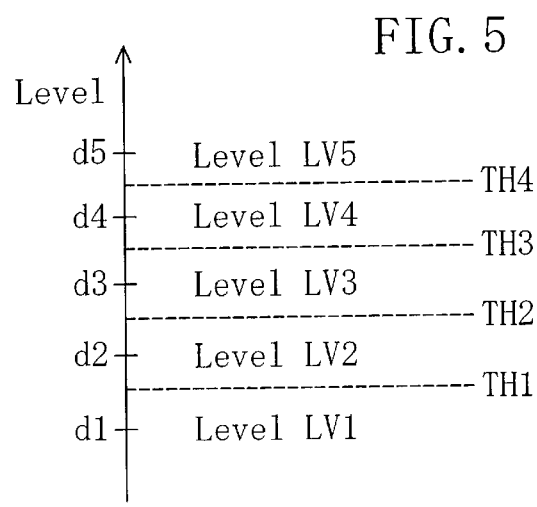
FIG. 5 illustrates the relationship between reference values and threshold values.

The adders 41 to 44 obtain the differences between the reproduced signal DS from the A/D converter 5 and threshold values TH1 to TH4, respectively, so as to output signs MSB1 to MSB4 of the respective differences. The threshold values TH1 to TH4 are determined, with respect to the reference values d1 to d5, as illustrated in FIG. 5. The threshold value TH4 is determined so as to satisfy $d4 \leq TH4 \leq d5$. The threshold value TH3 is determined so as to satisfy $d3 \leq TH3 \leq d4$. The threshold value TH2 is determined so as to satisfy $d2 \leq TH2 \leq d3$. The threshold value TH1 is determined so as to satisfy $d1 \leq TH1 \leq d2$. The reference values d1 to d5 are determined as follows. In the present embodiment, (1) RLL is used as a recording constraint for the recording medium, (2) NRZI is used as a recording format for the recording medium, and (3) the reproduced signal from the recording medium is weighted by a PR equalization method. Therefore, the reproduced signal DS from the A/D converter 5 ideally takes n values that are determined by the conditions (1) to (3). The number n varies depending on the type of RLL and the type of PR equalization method to be used. In the present embodiment, it is assumed that n=5. Therefore, the reproduced signal DS takes five different values, which are used as the reference values d1 to d5. Note however that the reference values d1 to d5 are ideal values and, in practice, there are displacements between the values of the reproduced signal DS and the reference values d1 to d5 due to wavering of the optical disk PD, noise, etc. As illustrated in FIG. 5, a level of the reproduced signal DS equal to or greater than the threshold value TH4 is designated as level LV5, a level of the reproduced signal DS equal to or greater than the threshold value TH3 and less than or equal to the threshold value TH4 is designated as level LV4, a level of the reproduced signal DS equal to or greater than the threshold value TH2 and less than or equal to the threshold value TH3 is designated as level LV3, a level of the reproduced signal DS equal to or greater than the threshold value TH1 and less than or equal to the threshold value TH2 is designated as level LV2, and a level of the reproduced signal DS less than or equal to the threshold value TH1 is designated as level LV1. The reference values d1 to d5 correspond to the levels LV1 to LV5, respectively.

The decoder 45 outputs a selection signal SEL1 according to the signs MSB1 to MSB4 from the adders 41 to 44. Specifically, as illustrated in FIG. 6, when the signs MSB1 to MSB4 are all (+), the reproduced signal DS is at the level LV5, in which case the decoder 45 outputs the selection signal SEL1 indicating the reference value d5. When the signs MSB1 to MSB3 are (+) and the sign MSB4 is (−), the reproduced signal DS is at the level LV4, in which case the decoder 45 outputs the selection signal SEL1 indicating the reference value d4. When the signs MSB1 and MSB2 are (+) and the signs MSB3 and MSB4 are (−), the reproduced signal DS is at the level LV3, in which case the decoder 45 outputs the selection signal SEL1 indicating the reference value d3. When the sign MSB1 is(+) and the signs MSB2 to MSB4 are (−) the reproduced signal DS is at the level LV2, in which case the decoder 45 outputs the selection signal SEL1 indicating the reference value d2. When the signs MSB1 to MSB4 are all (−), the reproduced signal DS is at the level LV1, in which case the decoder 45 outputs the selection signal SEL1 indicating the reference value d1.

The selector 46 outputs one of the reference values d1 to d5 that is indicated by the selection signal SEL1 from the decoder 45.

When the reference value from the selector 46 is included in the reference value(s) indicated by a selection signal SEL2, the comparator 47 outputs the error signal ES2 according to the difference between the reproduced signal DS from the A/D converter 5 and the reference value from the selector 46. On the other hand, when the reference value from the selector 46 is not included in the reference value(s) indicated by the selection signal SEL2, the comparator 47 keeps the previous value of the error signal ES2. The selection signal SEL2 is a signal that indicates one or more of the reference values d1 to d5 that should be compared with the reproduced signal DS. Herein, it is assumed that the selection signal SEL2 indicates all of the reference values d1 to d5. Therefore, the comparator 47 outputs the error signal ES2 according to the difference between the reproduced signal DS and one of the reference values d1 to d5 that corresponds to one of the levels LV1 to LV5 to which the reproduced signal DS belongs.

OPERATION OF AUTOMATIC GAIN CONTROL CIRCUIT AGC

Next, an operation of the automatic gain control circuit AGC illustrated in FIG. 1 will be described.

Figure 7:
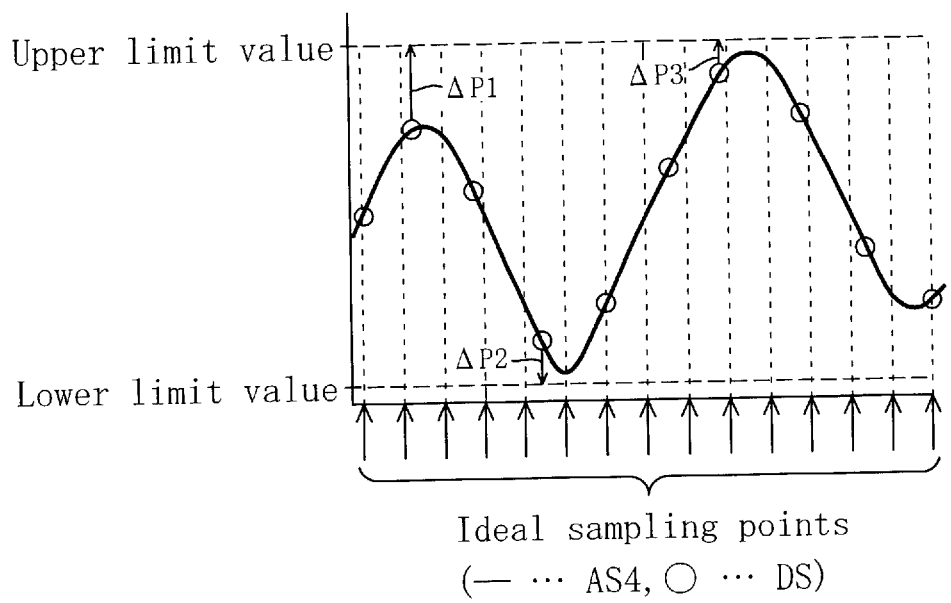
FIG. 7 illustrates the sampling points and the output of an A/D converter in a state where a PLL circuit illustrated in FIG. 1 is not locked.

At the start of the series of reproduced signal processing operations, the PLL circuit 6 is not locked. In other words, the reproduced signal DS from the A/D converter 5 and the clock CLK from the PLL circuit 6 are not synchronized with each other. Therefore, the sampling points of the A/D converter 5 are shifted from the ideal sampling points, as illustrated in FIG. 7. The ideal sampling points are those that are synchronized with the clock CLK in a state where the PLL circuit 6 is locked. As illustrated in FIG. 7, in a state where the PLL circuit 6 is not locked, the level of the reproduced signal DS changes irregularly. Nevertheless, the peak of the reproduced signal DS can be detected. Therefore, in such a state, the error signal ES1 according to the differences ΔP1 to ΔP3 between the peak values of the reproduced signal DS and the upper or lower limit value of the dynamic range of the A/D converter 5 is given to the control signal generation circuit 8. Then, in the control signal generation circuit 8, the error signal ES1 is amplified by using a predetermined loop gain value, and the amplified signal is output as the gain control signal VC. In the variable gain amplifier 3, the reproduced signal AS2 is amplified with a gain according to the gain control signal VC. In this way, the differences ΔP1 to ΔP3 between the peak values of the reproduced signal DS from the A/D converter 5 and the upper or lower limit value of the dynamic range of the A/D converter 5 decrease. In other words, the amplitude level of the reproduced signal AS4 is brought closer to the dynamic range of the A/D converter 5.

Figure 8:
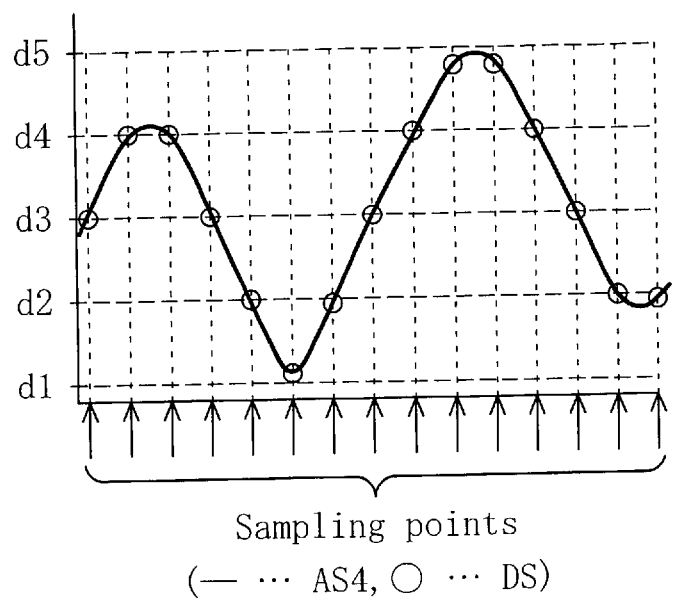
FIG. 8 illustrates the sampling points and the output of the A/D converter in a state where the PLL circuit illustrated in FIG. 1 is locked.

After passage of a certain period of time from the start of the reproduced signal processing, the PLL circuit 6 is locked. In other words, the reproduced signal DS from the A/D converter 5 and the clock CLK from the PLL circuit 6 are synchronized with each other. In a state where the PLL circuit 6 is locked, the reproduced signal DS takes a level that is substantially equal to one of five values (reference values d1 to d5) at any sampling point of the A/D converter 5, as illustrated in FIG. 8. In such a state, the error signal ES2 according to the difference between the reproduced signal DS and one of the reference values d1 to d5 that corresponds to one of the levels LV1 to LV5 to which the reproduced signal DS belongs is given to the control signal generation circuit 8. Then, in the control signal generation circuit 8, the error signal ES2 is amplified by using a predetermined loop gain value, and the amplified signal is output as the gain control signal VC. In the variable gain amplifier 3, the reproduced signal AS2 is amplified with a gain according to the gain control signal VC. In this way, the amplitude level of the reproduced signal AS4 is brought to a level that is matched with the dynamic range of the A/D converter 5. As described above, not only the peak values of the reproduced signal DS, but also the intermediate values thereof, are used in the calculation of the error signal ES2. Therefore, as compared to a case where only the peak values of the reproduced signal DS are used, the amplitude level of the reproduced signal AS4 is better matched with the dynamic range of the A/D converter 5 and is more stable.

Note that the variation of the difference between the reproduced signal DS and the reference values d1 to d5 is dependent on the level, among the levels LV1 to LV5, to which the reproduced signal DS belongs. Therefore, although all of the five values of the reproduced signal DS are used in the calculation of the error signal ES2, only one or more of the values with which the variation is small may be selectively used in the calculation of the error signal ES2. Such a selection can be made by using the selection signal SEL2 illustrated in FIG. 4.

EFFECTS

As described above, the level error calculation circuit 22 is provided in the reproduced signal processing circuit according to the first embodiment of the present invention, whereby the amplitude level of the reproduced signal AS4 in a state where the PLL circuit 6 is locked can be brought to a level that is matched with the dynamic range of the A/D converter 5 and is stable.

Moreover, when the PLL circuit 6 is not locked, the error signal ES1 from the peak error calculation circuit 21 is given to the control signal generation circuit 8 as the error signal ES. Therefore, until the PLL circuit 6 is locked, the amplitude level of the reproduced signal AS4 can be brought somewhat closer to the level that is matched with the dynamic range of the A/D converter 5. In this way, it is possible to reduce the amount of time required for bringing the amplitude level of the reproduced signal AS4 to a level that is matched with the dynamic range of the A/D converter 5 and is stable.

VARIATION

Figure 9:
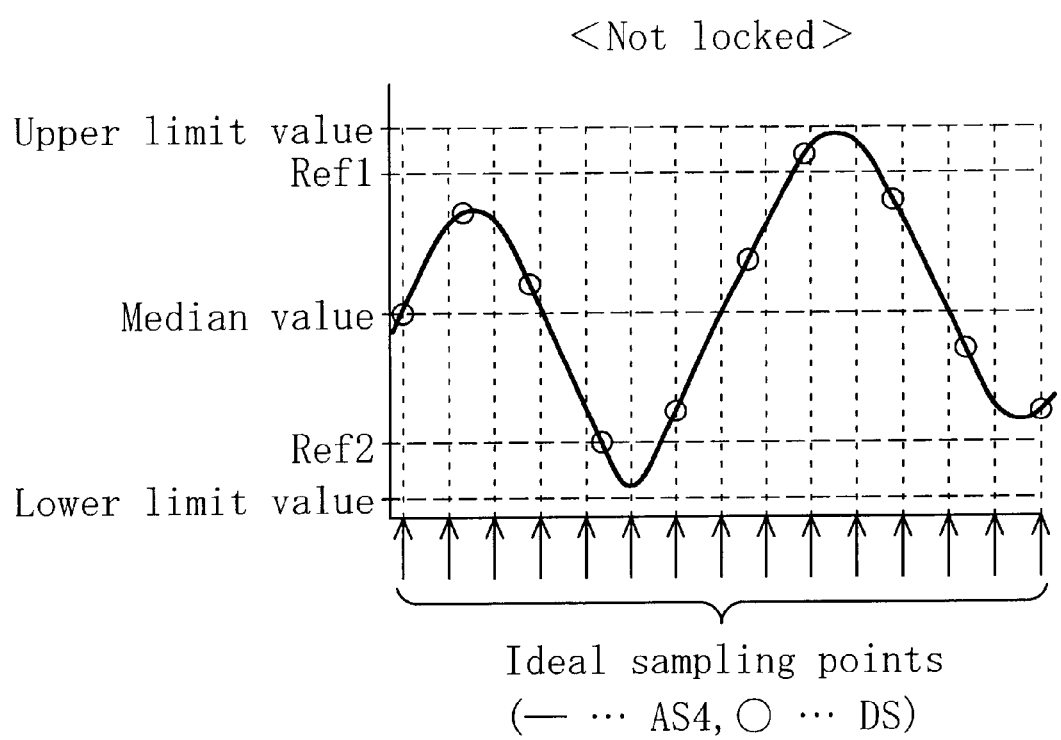
FIG. 9 illustrates the sampling points and the output of the A/D converter in a state where the PLL circuit illustrated in FIG. 1 is not locked.

Note that the upper or lower limit value of the dynamic range of the A/D converter 5 is used herein as a value to be compared with the peak value of the reproduced signal DS in a state where the PLL circuit 6 is not locked, as illustrated in FIG. 7. Therefore, the amplitude level of the reproduced signal DS may possibly exceed the dynamic range of the A/D converter 5. This can be avoided by using, as a value to be compared with the peak value of the reproduced signal DS, a reference value Ref1 that is smaller than the upper limit value of the dynamic range of the A/D converter 5 and greater than the median value thereof or a reference value Ref2 that is greater than the lower limit value and smaller than the median value, as illustrated in FIG. 9.

SECOND EMBODIMENT

Figure 10:
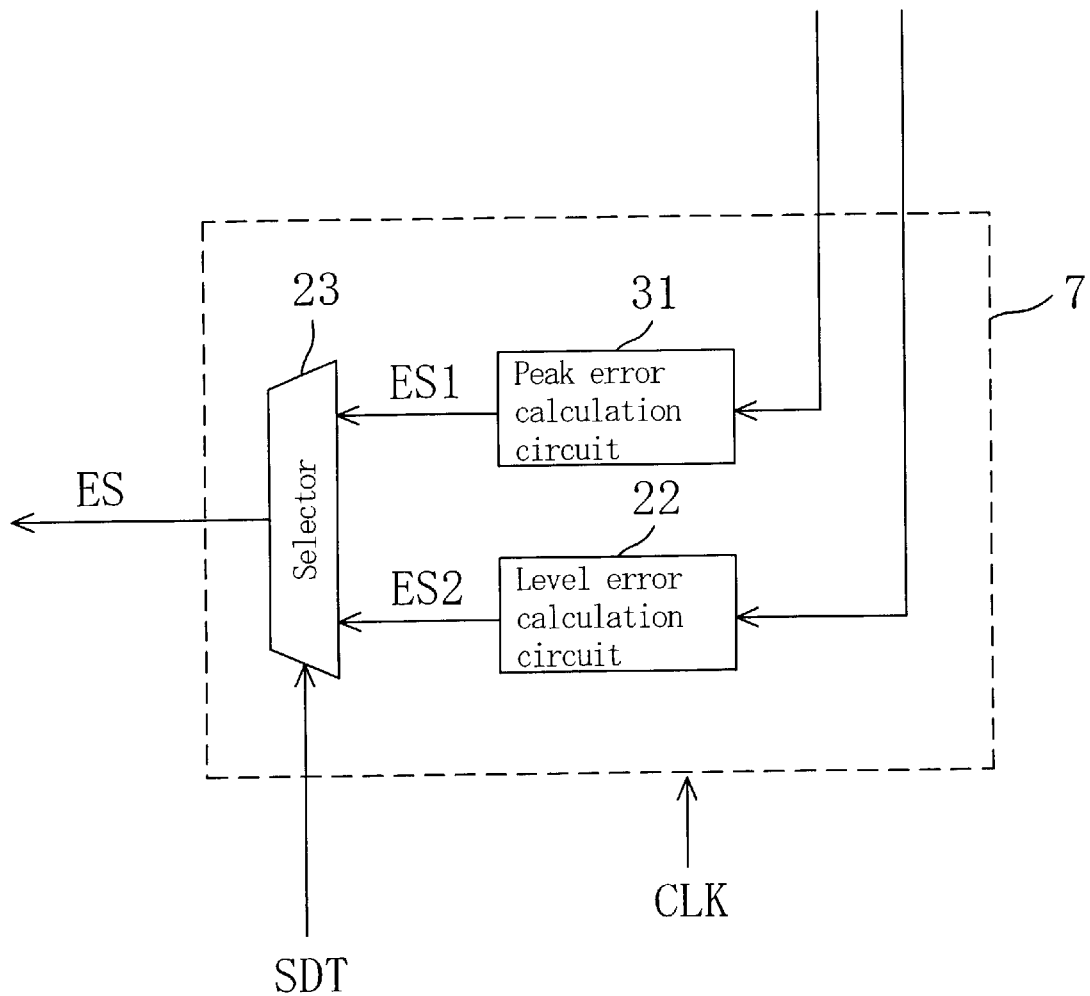
FIG. 10 is a block diagram illustrating an internal configuration of an error calculation section in a reproduced signal processing circuit according to the second embodiment of the present invention.

In a reproduced signal processing circuit according to the second embodiment of the present invention, the error calculation section 7 includes a peak error calculation circuit 31 illustrated in FIG. 10, instead of the peak error calculation circuit 21 illustrated In FIG. 2. Other than this, the reproduced signal processing circuit is as that of the first embodiment.

The peak error calculation circuit 31 illustrated in FIG. 10 calculates the amplitude level of the reproduced signal AS4 from the equalizer 4, and outputs the error signal ES1 according to the difference between the calculated amplitude level and a reference value. This will now be described in greater detail.

Figure 11:
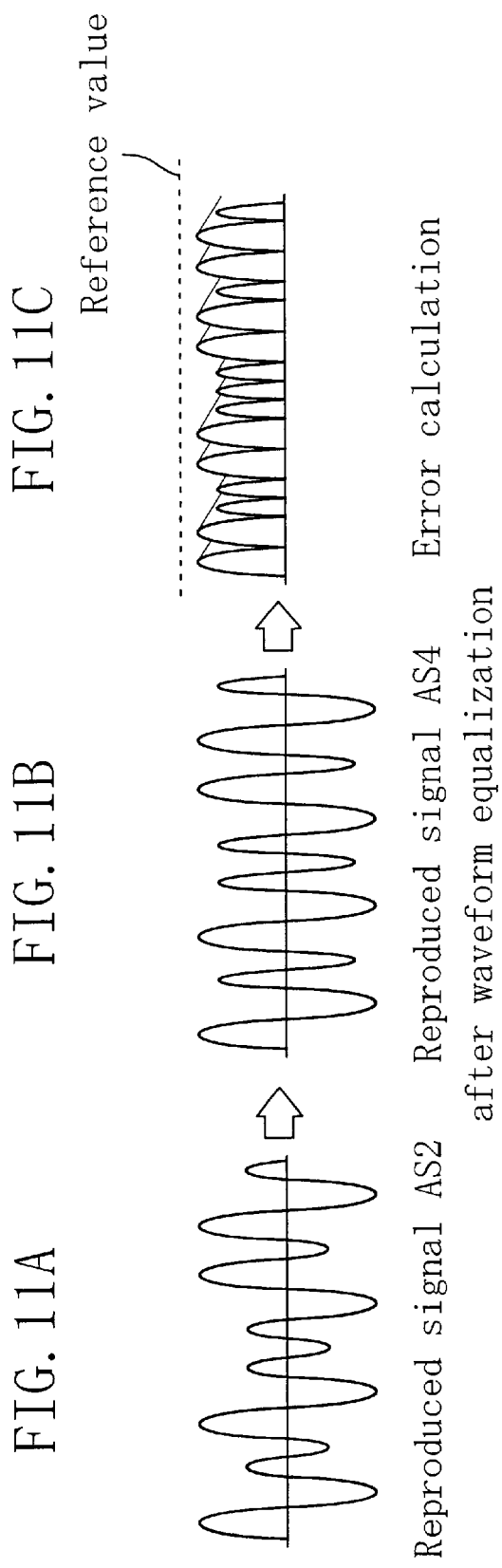
FIG. 11A to FIG. 11C illustrate a procedure of calculating an error signal by a peak error calculation circuit illustrated in FIG. 10.

The reproduced signal AS2 having a waveform as illustrated in FIG. 11A is turned into a signal having a waveform as illustrated in FIG. 11B through a waveform equalization process by the equalizer 4. In the peak error calculation circuit 31, the reproduced signal AS4, which has been subjected to a waveform equalization process, is subjected to a full wave rectification process, and then passed through a low-pass filter so as to smooth the waveform peaks, as illustrated in FIG. 11C. Then, the average value of the peaks of the reproduced signal is calculated. Then, the calculated average value and the reference value corresponding to the dynamic range of the A/D converter are compared with each other so as to calculate the error therebetween. Then, the error signal ES1 according to the calculated error is generated. Effects as those of the first embodiment can be obtained also in a case where such a peak error calculation circuit 31 is provided.

THIRD EMBODIMENT

Figure 12:
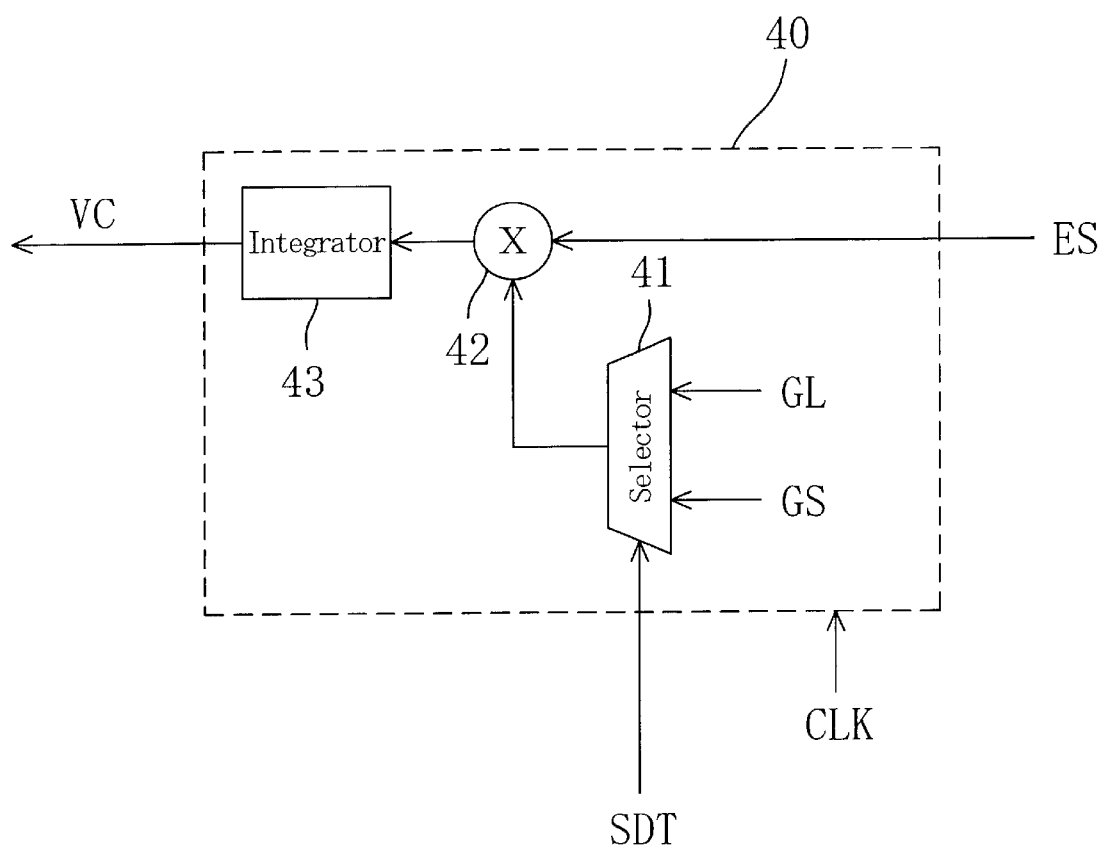
FIG. 12 is a block diagram illustrating an internal configuration of a control signal generation circuit in a reproduced signal processing circuit according to the third embodiment of the present invention.

A reproduced signal processing circuit according to the third embodiment of the present invention includes a control signal generation circuit 40 illustrated in FIG. 12, instead of the control signal generation circuit 8 illustrated in FIG. 1. Other than this, the reproduced signal processing circuit is as that illustrated in FIG. 1.

Referring to FIG. 12, the control signal generation circuit 40 includes a selector 41, a multiplier 42 and an integrator 43. The selector 41 gives a loop gain GL to the multiplier 42 when the sync detection signal SDT from the PLL circuit 6 is at L level, and gives a loop gain GS to the multiplier 42 when the sync detection signal SDT is at H level. The loop gain GL is greater than the loop gain GS. The multiplier 42 outputs, to the integrator 43, the product between the error signal ES from the error calculation section 7 illustrated in FIG. 1 and the loop gain from the selector 41. The integrator 43 integrates the product from the multiplier 42 for a predetermined period of time, and outputs the obtained value as the gain control signal VC.

In the reproduced signal processing circuit having such a configuration, when the PLL circuit 6 is not locked, i.e., when the sync detection signal SDT is at L level, the greater loop gain GL is given to the multiplier 42 to generate the gain control signal VC based on the product between the loop gain GL and the error signal ES. Therefore, the variable gain amplifier 3 amplifies the reproduced signal AS2 with a gain that is greater than that when the loop gain GS is given to the multiplier 42. In this way, the amplitude level of the reproduced signal AS4 is brought roughly to the dynamic range of the A/D converter 5. On the other hand, when the PLL circuit 6 is locked, i.e., when the sync detection signal SDT is at H level, the smaller loop gain GS is given to the multiplier 42 to generate the gain control signal VC based on the product between the loop gain GS and the error signal ES. Therefore, the variable gain amplifier 3 amplifies the reproduced signal AS2 with a gain that is smaller than that when the loop gain GL is given to the multiplier 42, i.e., when the PLL circuit 6 is not locked. In this way, the amplitude level of the reproduced signal AS4 is finely adjusted to a level that is matched with the dynamic range of the A/D converter 5 and is stable.

As described above, in the reproduced signal processing circuit according to the third embodiment, the loop gain GS is given to the multiplier 42 when the PLL circuit 6 is not locked, and the loop gain GL is given to the multiplier 42 when the PLL circuit 6 is locked, whereby the amplitude level of the reproduced signal AS4 can be adjusted effectively.

FOURTH EMBODIMENT

Figure 13:
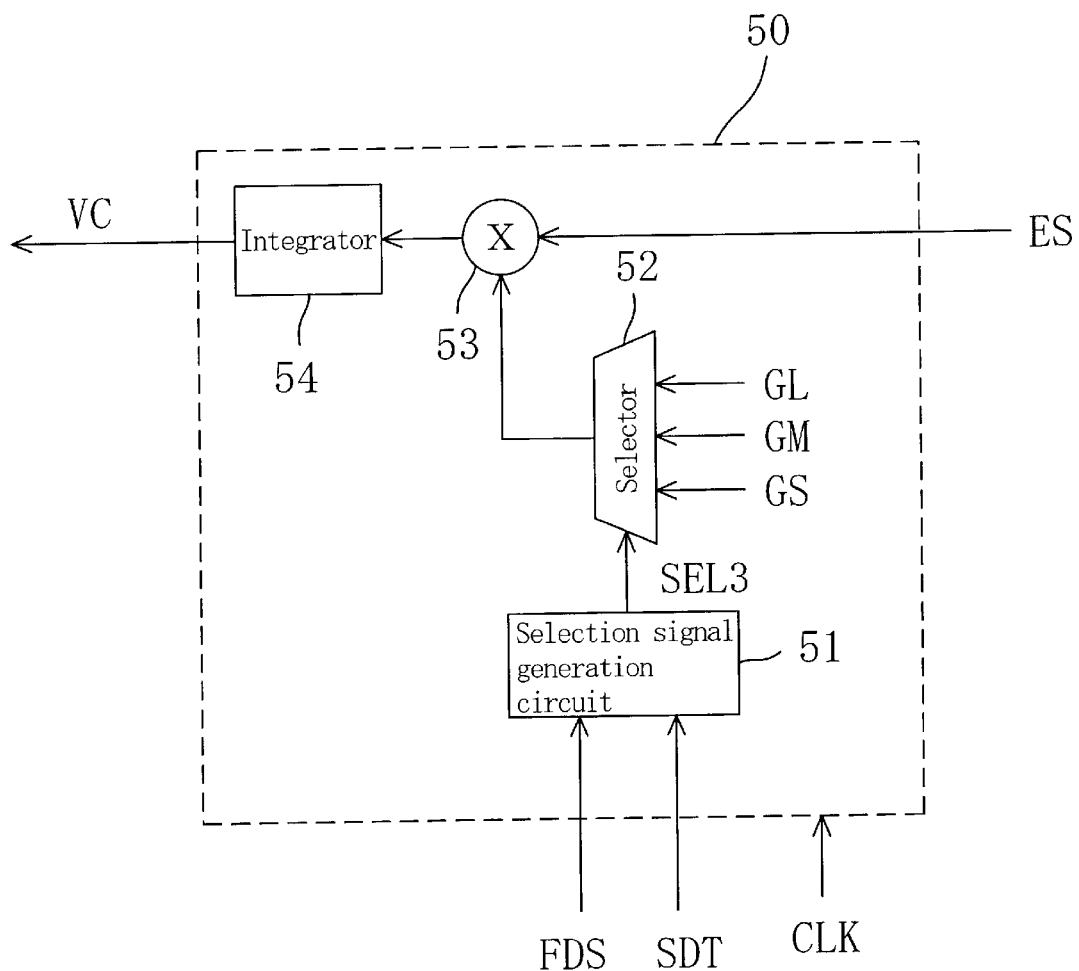
FIG. 13 is a block diagram illustrating an internal configuration of a control signal generation circuit in a reproduced signal processing circuit according to the fourth embodiment of the present invention.

A reproduced signal processing circuit according to the fourth embodiment of the present invention includes a control signal generation circuit 50 illustrated in FIG. 13, instead of the control signal generation circuit 8 illustrated in FIG. 1. Other than this, the reproduced signal processing circuit is as that illustrated in FIG. 1.

Referring to FIG. 13, the control signal generation circuit 50 includes a selection signal generation circuit 51, a selector 52, a multiplier 53 and an integrator 54. The selection signal generation circuit 51 gives a selection signal SEL3 to the selector 52 according to a format identification signal FDS and the sync detection signal SDT. The format identification signal FDS is at H level when data recorded on the optical disk PD is in a read-only (ROM) disk format, and is at L level when the data is in a readable/writable (RAM) disk format. The selection signal SEL3 is a signal that indicates which one of loop gains GL, GM and GS is to be given to the multiplier 53. The selector 52 gives one of the loop gains GL, GM and GS to the multiplier 53 according to the selection signal SEL3 from the selection signal generation circuit 51. The magnitudes of the loop gains GL, GM and GS are in the relationship of GS<GM<GL. The multiplier 53 outputs, to the integrator 54, the product between the error signal ES from the error calculation section 7 illustrated in FIG. 1 and the loop gain from the multiplier 53. The integrator 54 integrates the product from the multiplier 53 for a predetermined period of time, and outputs the obtained value as the gain control signal VC.

Next, an operation of the reproduced signal processing circuit having such a configuration will be described separately for a case where the format identification signal FDS is at H level and for a case where it is at L level.

(1) Where Format Identification Signal FDS is at H Level

Figure 14:
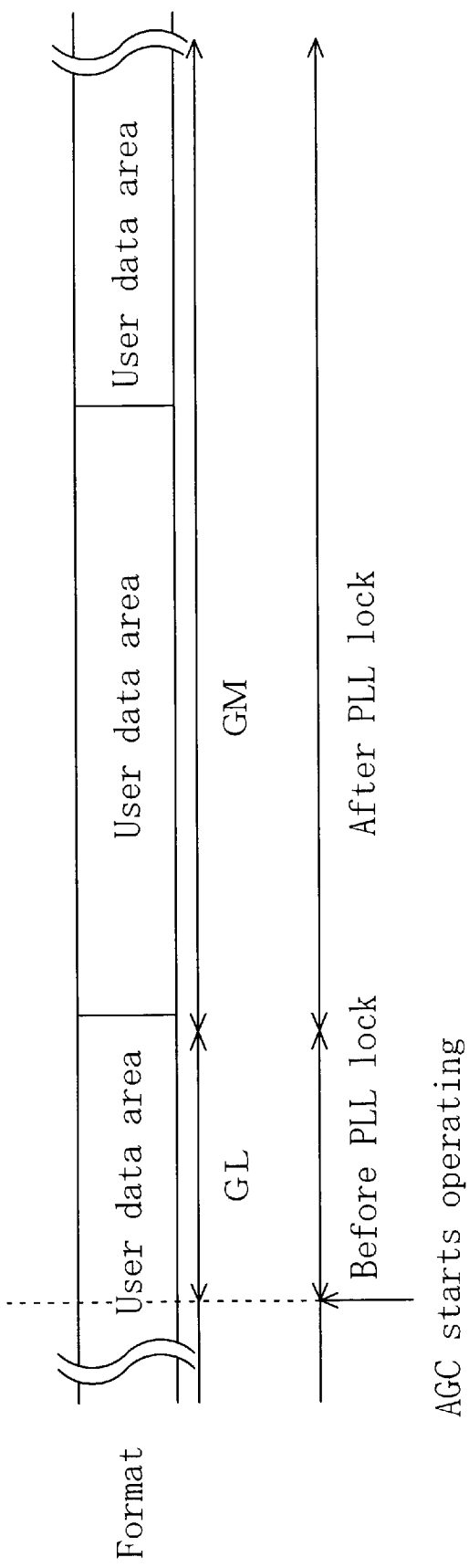
FIG. 14 illustrates the correlation between a format of a read-only disk and a loop gain.

Data is recorded on the optical disk PD in a ROM disk format. Specifically, user data, i.e., random data, is recorded in each sector, as illustrated in FIG. 14. From the start of the operation of the automatic gain control circuit AGC until the PLL circuit 6 is locked, the selection signal generation circuit 51 gives the selection signal SEL3, indicating the loop gain GL, to the selector 52. The selector 52, receiving the selection signal SEL3, gives the loop gain GL to the multiplier 53. The gain control signal VC is generated based on the product between the loop gain GL and the error signal ES. In this way, the amplitude level of the reproduced signal AS4 is brought roughly to the dynamic range of the A/D converter 5. After the PLL circuit 6 is locked, the selection signal generation circuit 51 gives the selection signal SEL3, indicating the loop gain GM, to the selector 52. The selector 52, receiving the selection signal SEL3, gives the loop gain GM to the multiplier 53. The gain control signal VC is generated based on the product between the loop gain GM and the error signal ES. In this way, the amplitude level of the reproduced signal AS4 is finely adjusted to a level that is matched with the dynamic range of the A/D converter 5 and is stable.

(2) Where Format Identification Signal FDS is at L Level

Figure 15:
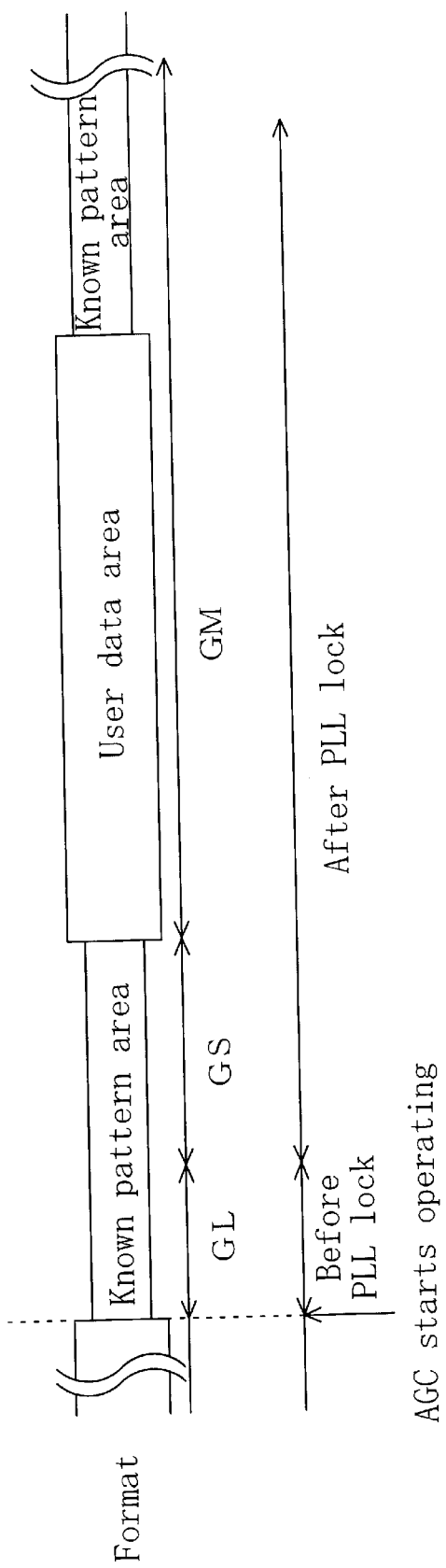
FIG. 15 illustrates the correlation between a format of a readable/writable disk and a loop gain.

Data is recorded on the optical disk PD in a RAM disk format. Specifically, a known pattern called "VFO (Voltage Frequency Oscillator) pattern" is located between adjacent user data areas, as illustrated in FIG. 15. While the VFO pattern is reproduced, the loop gain of the PLL circuit 6 is increased and a sync pull-in operation is performed at a high speed. The VFO pattern is a pattern that has a cycle of 4T+4T, where T is a recording channel bit.

After the start of the operation of the automatic gain control circuit AGC in a known pattern area until the PLL circuit 6 is locked, the selection signal generation circuit 51 gives the selection signal SEL3, indicating the loop gain GL, to the selector 52. The selector 52, receiving the selection signal SEL3, gives the loop gain GL to the multiplier 53. The gain control signal VC is generated based on the product between the loop gain GL and the error signal ES. In this way, the amplitude level of the reproduced signal AS4 is brought roughly to the dynamic range of the A/D converter 5. After the PLL circuit 6 is locked in the known pattern area, the selection signal generation circuit 51 gives the selection signal SEL3, indicating the loop gain GS, to the selector 52. The selector 52, receiving the selection signal SEL3, gives the loop gain GS to the multiplier 53. The gain control signal VC is generated based on the product between the loop gain GS and the error signal ES. In this way, the amplitude level of the reproduced signal AS4 is adjusted, more finely than in a user data area, to a level that is matched with the dynamic range of the A/D converter 5 and is stable. Since data of a set pattern is recorded in a know pattern area, the reproduced signal therefrom has less disturbance than that from a user data area, where random data is recorded. Therefore, the gain control signal VC is generated by using the loop gain GS, which is smaller than the loop gain GM used for reproduced data from a user data area. Then, after moving from the know pattern area into a user data area, the selection signal generation circuit 51 gives the selection signal SEL3, indicating the loop gain GM, to the selector 52. The selector 52, receiving the selection signal SEL3, gives the loop gain GM to the multiplier 53. The gain control signal VC is generated based on the product between the loop gain GM and the error signal ES. In this way, the amplitude level of the reproduced signal AS4 is finely adjusted to a level that is matched with the dynamic range of the A/D converter 5 and is stable.

Note that the loop gain may be switched from GM to GS within a user data area, or the loop gain may be switched from GM to GS when moving from a user data area into a known pattern area.

As described above, according to the fourth embodiment, the amplitude level of the reproduced signal AS4 can be adjusted effectively according to the format of the data recorded on the optical disk PD.

What is claimed is:

1. An automatic gain control circuit, comprising:
   a variable gain amplifier for amplifying a reproduced signal from a recording medium;
   an A/D converter for quantizing the reproduced signal, which has been amplified by the variable gain amplifier;
   a clock generation circuit for generating a clock that is synchronized with the reproduced signal, which has been quantized by the A/D converter;
   an error calculation section for generating an error signal according to a difference between the reproduced signal, which has been quantized by the A/D converter, and one of n values (n is a positive integer) that corresponds to the reproduced signal, which has been quantized by the A/D converter, the n values being determined by a recording constraint and a recording format for the recording medium and a method for weighting the reproduced signal from the recording medium; and
   a control signal generation circuit for generating a gain control signal based on the error signal generated by the error calculation section, wherein:
   the A/D converter quantizes the reproduced signal, which has been amplified by the variable gain amplifier, in synchronism with the clock from the clock generation circuit; and
   the variable gain amplifier amplifies the reproduced signal from the recording medium with a gain according to a level of the gain control signal from the control signal generation circuit.

2. The automatic gain control circuit of claim 1, wherein the error calculation section generates the error signal when one of the n values that corresponds to the reproduced signal, which has been quantized by the A/D converter, is a desired value.

3. The automatic gain control circuit of claim 1, wherein:
   when the clock from the clock generation circuit is not synchronized with the reproduced signal, which has been quantized by the A/D converter, the error calculation section generates the error signal according to a difference between a peak of the reproduced signal, which has been quantized by the A/D converter, and a predetermined reference value; and
   when the clock from the clock generation circuit is synchronized with the reproduced signal, which has been quantized by the A/D converter, the error calculation section generates the error signal according to a difference between the reproduced signal, which has been quantized by the A/D converter, and one of n values (n is a positive integer) that corresponds to the reproduced signal, which has been quantized by the A/D converter, the n values being determined by a recording constraint and a recording format for the recording medium and a method for weighting the reproduced signal from the recording medium.

4. The automatic gain control circuit of claim 3, wherein the predetermined reference value is an upper or lower limit value of a dynamic range of the A/D converter.

5. The automatic gain control circuit of claim 3, wherein the predetermined reference value is a value that is smaller than an upper limit value of a dynamic range of the A/D converter and greater than a median value thereof, or a value that is greater than a lower limit value of the dynamic range of the A/D converter and smaller than the median value thereof.

6. The automatic gain control circuit of claim 3, wherein:

when the clock from the clock generation circuit is not synchronized with the reproduced signal, which has been quantized by the A/D converter, the control signal generation circuit generates the gain control signal based on a product between the error signal generated by the error calculation section and a first multiplier; and when the clock from the clock generation circuit is synchronized with the reproduced signal, which has been quantized by the A/D converter, the control signal generation circuit generates the gain control signal based on a product between the error signal generated by the error calculation section and a second multiplier that is smaller than the first multiplier.

7. The automatic gain control circuit of claim 6, wherein the control signal generation circuit changes the second multiplier depending on a format of data recorded on the recording medium.

8. The automatic gain control circuit of claim 1, wherein:

when the clock from the clock generation circuit is not synchronized with the reproduced signal, which has been quantized by the A/D converter, the error calculation section generates the error signal according to a difference between a peak of the reproduced signal from the variable gain amplifier and a predetermined reference value; and when the clock from the clock generation circuit is synchronized with the reproduced signal, which has been quantized by the A/D converter, the error calculation section generates the error signal according to a difference between the reproduced signal, which has been quantized by the A/D converter, and one of n values (n is a positive integer) that corresponds to the reproduced signal, which has been quantized by the A/D converter, the n values being determined by a recording constraint and a recording format for the recording medium and a method for weighting the reproduced signal from the recording medium.

9. The automatic gain control circuit of claim 8, wherein:

when the clock from the clock generation circuit is not synchronized with the reproduced signal, which has been quantized by the A/D converter, the control signal generation circuit generates the gain control signal based on a product between the error signal generated by the error calculation section and a first multiplier; and when the clock from the clock generation circuit is synchronized with the reproduced signal, which has been quantized by the A/D converter, the control signal generation circuit generates the gain control signal based on a product between the error signal generated by the error calculation section and a second multiplier that is smaller than the first multiplier.

10. The automatic gain control circuit of claim 9, wherein the control signal generation circuit changes the second multiplier depending on a format of data recorded on the recording medium.

* * * * *